United States Patent [19]

Sano et al.

[11] Patent Number: 4,577,121
[45] Date of Patent: Mar. 18, 1986

[54] DIFFERENTIAL CIRCUIT

[75] Inventors: Yoshiaki Sano; Isamu Omura; Ryo Hiramatsu, all of Kawasaki, Japan

[73] Assignee: Fujitsu Limited, Kawasaki, Japan

[21] Appl. No.: 450,763

[22] Filed: Dec. 17, 1982

[30] Foreign Application Priority Data

Dec. 17, 1981 [JP] Japan .................. 56-204317

[51] Int. Cl.[4] .............................. H03K 5/24
[52] U.S. Cl. .................. 307/355; 307/549; 307/494
[58] Field of Search .......... 307/362, 355, 356, 542, 307/546, 549, 555, 562, 567, 350, 494

[56] References Cited

U.S. PATENT DOCUMENTS 3,872,323  3/1975  Frederiksen et al. ............. 307/362
4,177,394  12/1979  Takasugi ........................ 307/357
4,379,240  4/1983  Mammano ........................ 307/356

FOREIGN PATENT DOCUMENTS 2905629  8/1979  Fed. Rep. of Germany .
3120979  2/1982  Fed. Rep. of Germany .
3119923  2/1982  Fed. Rep. of Germany .
1241432  8/1971  United Kingdom .

OTHER PUBLICATIONS

Patent Abstract of Japan, vol. 5, No. 149, Sep. 19, 1981.

*Primary Examiner*—John Zazworsky
*Attorney, Agent, or Firm*—Staas & Halsey

[57] ABSTRACT

A differential circuit, such as a comparator circuit or an operational amplifier circuit, including an output-error preventing circuit having an npn transistor and a constant voltage source. The output of the differential circuit is kept at the correct value corresponding to the difference of two inputs of the differential circuit, even if one of the two inputs becomes negative.

4 Claims, 7 Drawing Figures

DIFFERENTIAL CIRCUIT

BACKGROUND OF THE INVENTION

(1) Field of the Invention

The present invention relates to a differential circuit for producing an output in response to the difference between two inputs and, especially, to a differential circuit in which the output error of the circuit, occurring when one of the two inputs falls below the lower limit of the ordinary operation range, can be prevented.

(2) Description of the Prior Art

Generally, a differential circuit, such as a comparator or an operational amplifier, which produces an output in response to the difference of two inputs, is designed so as to operate normally only when the variation of the input signals remains between voltage supply level and the ground level. For example, if the voltage supply $V_{CC}$ is +5 V, a comparison is made of the two inputs in the range between 0 V and +5 V, i.e., the positive voltage range. Conventional comparator circuits, however, cannot operate normally when an input becomes negative due to noise etc.

SUMMARY OF THE INVENTION

An object of the present invention is to provide a differential circuit in which the output of the circuit can be kept at the correct value corresponding to the results of the comparison between the two inputs, even if one of the two inputs becomes negative.

Another object of the present invention is to provide a differential circuit in which the level of an input can be clamped so as to prevent damage to the internal circuit when a negative voltage is applied to that input.

In accordance with the present invention, there is provided a differential circuit including a differential stage having first and second transistors for respectively receiving first and second inputs. The differential stage compares the potentials of the first and second inputs to provide an output corresponding to a state of the second transistor. A control stage is provided, having a control transistor, the control transistor being driven by the output of the differential stage. An output stage connected to the control transistor and having an output transistor which has a base current controlled by the control transistor. Also included in the differential circuit is an error-output preventing means having an error-output preventing transistor, the error-output preventing transistor becoming on when the potential of the second input becomes lower than a predetermined value, so as to keep the output transistor at a correct state corresponding to the relation of the potentials of the first and second inputs even if the potential of the second input becomes lower than the predetermined value.

DESCRIPTION OF THE PREFERRED EMBODIMENTS

The present invention will now be described in more detail with reference to preferred embodiments in comparison with the prior art.

Figure 1:
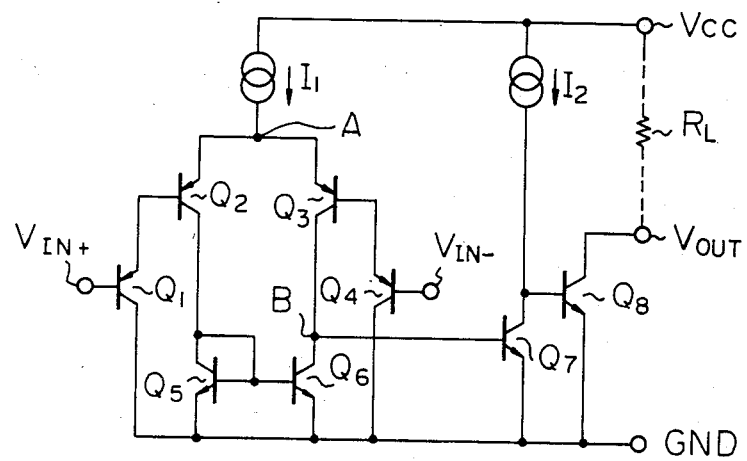
FIG. 1 is a diagram of a prior art differential circuit.

A prior art differential circuit is illustrated in FIG. 1. The differential circuit of FIG. 1 is a comparator circuit comprising transistors $Q_1$ through $Q_8$ and constant current sources $I_1$ and $I_2$. The transistors $Q_1$ through $Q_6$ form a differential stage. The transistor $Q_7$ is a control transistor driven by the output of the differential stage, and the transistor $Q_8$ is an output transistor of the open collector type, the base current of which is controlled by the transistor $Q_7$. A resistor $R_L$ is a load connected between a voltage supply $V_{CC}$ and an output $V_{OUT}$. In the comparator circuit of FIG. 1, two inputs $V_{IN+}$ and $V_{IN-}$ are compared to detect which is higher. The output $V_{OUT}$ is produced in response to the result of the comparison.

Figure 2:
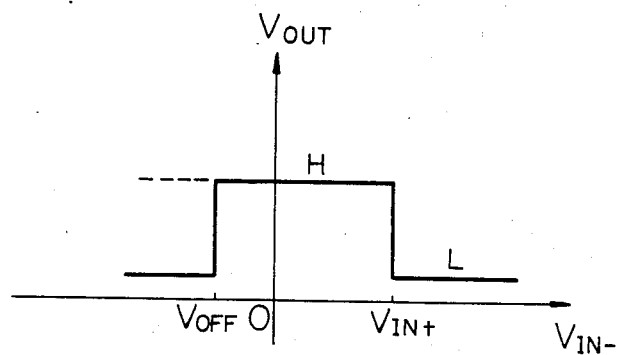
FIG. 2 is a graph of the characteristics of the circuit of FIG. 1.

For example, assume that one input $V_{IN+}$ is fixed at a constant positive value $V_{IN}$ and that the other input $V_{IN-}$ is changed between the voltage supply $V_{CC}$ and ground GND. In such a case, the output $V_{OUT}$ is changed as shown in FIG. 2. When $V_{IN-} > V_{IN+}$, the transistors $Q_1$ and $Q_2$ are on and the transistors $Q_3$ and $Q_4$ are off, because the transistors $Q_1$ through $Q_4$ are pnp type. Thus the constant current $I_1$ flows through the transistor $Q_2$, and the transistors $Q_5$ and $Q_6$ become on. Since the output of the differential stage is supplied from the collector of the transistor $Q_3$, no current flows to the base of the transistor $Q_7$ in the above case. Thus, the transistor $Q_7$ becomes off. Consequently, the constant current $I_2$ flows to the base of the transistor $Q_8$, the transistor $Q_8$ becomes on, and the output $V_{OUT}$ becomes "L" (low), as shown in FIG. 2.

Conversely, when $V_{IN-} < V_{IN+}$, the transistors $Q_3$ and $Q_4$ are on and the transistors $Q_1$ and $Q_2$ are off. Thus, the constant current $I_1$ flows through the transistor $Q_3$, and the transistors $Q_5$ and $Q_6$ become off. Consequently, the current flowing through the transistor $Q_3$ flows to the base of the transistor $Q_7$ and makes the transistor $Q_7$ on. The turning on of the transistor $Q_7$ stops the current I from flowing to the base of the transistor $Q_8$, whereupon the transistor $Q_8$ becomes off and the output $V_{OUT}$ becomes "H" (high).

When the input $V_{IN-}$ becomes negative due to noise or the like, however, there is a problem. When the transistors $Q_3$ and $Q_4$ are on, the potential at the emitter of the transistor $Q_3$, i.e., the node A, becomes $V_{IN-} + 2 V_{BE}$ ($V_{BE}$ is the base-emitter voltage). In this case, in order to keep the transistor $Q_7$ on, the potential at the base of the transistor $Q_7$, i.e., the node B, must be $V_{BE}$. Accordingly, when the input $V_{IN-}$ becomes negative, the potential difference between the nodes A and B is decreased, resulting in the potential at the node B not being able to be kept at $V_{BE}$ and the transistor $Q_3$ not being able to be kept on. Thus, when the input $V_{IN-}$ becomes lower than a negative voltage $V_{OFF}$, base current is not supplied to the transistor $Q_7$ and the transistor $Q_7$ turns from on to off. Accordingly, the transistor $Q_8$ turns from off to on, and the output $V_{OUT}$ turns from "H" to "L". Thus, even though $V_{IN-} < V_{IN+}$, the output $V_{OUT}$ becomes "L" when the input $V_{IN-}$ becomes lower than $V_{OFF}$, as shown in FIG. 2. This inversion of the output $V_{OUT}$ is not desirable for circuit operation.

Figure 3:
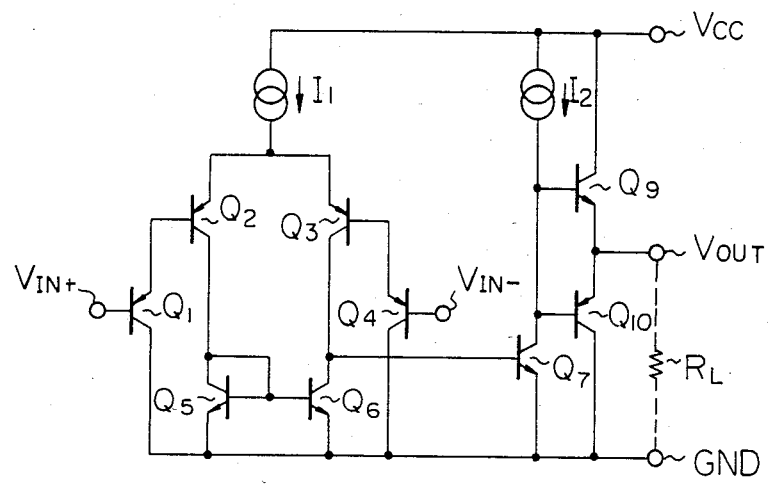
FIG. 3 is a diagram of a second prior art differential circuit.

Another prior art differential circuit is shown in FIG. 3. The differential circuit, an operational amplifier circuit, has the same construction as the circuit of FIG. 1, except that its output portion comprises an npn transistor $Q_9$ and a pnp transistor $Q_{10}$ connected in series between the voltage supply $V_{CC}$ and the ground GND, and the output $V_{OUT}$ changes linearly between $V_{CC}$ and GND. The operational amplifier circuit of FIG. 3 has the same problem as described above regarding the circuit of FIG. 1.

Figure 4:
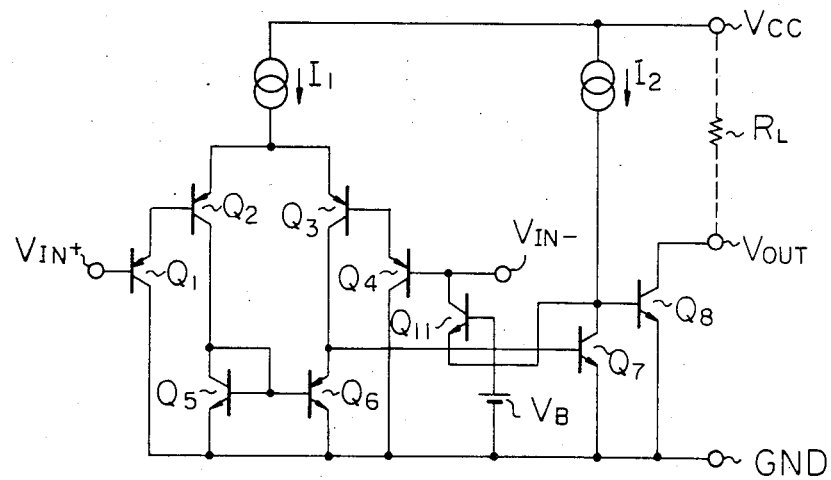
FIG. 4 is a diagram of a differential circuit according to an embodiment of the present invention.

A differential circuit according to one embodiment of the present invention is illustrated in FIG. 4. The differential circuit, a comparator circuit, comprises differential stage transistors $Q_1$ through $Q_6$, a control transistor $Q_7$, an output stage transistor $Q_8$, and constant current sources $I_1$ and $I_2$, just as the circuit of FIG. 1. The comparator circuit further comprises an npn transistor $Q_{11}$ and a constant voltage source $V_B$. The collector of the transistor $Q_{11}$ is connected to the base of the transistor $Q_4$ and the emitter of the transistor $Q_{11}$ is connected to the collector of the transistor $Q_7$. The constant voltage source $V_B$ is connected between the base of the transistor $Q_{11}$ and ground GND and is set at value of +0.2 V to +0.5 V.

Figure 5A:
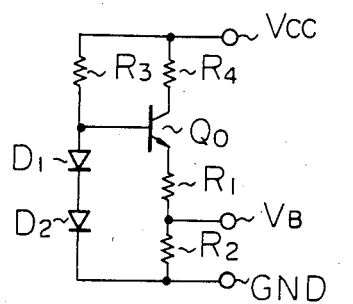
FIGS. 5A and 5B are circuit diagrams of two constant voltage sources which can be used as $V_B$ in the circuit of FIG. 4.
Figure 5B:
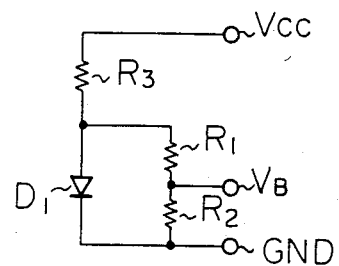

The constant voltage source $V_B$ may be constructed as shown in FIGS. 5A or 5B. The circuit of FIG. 5A has diodes $D_1$ and $D_2$ as constant voltage elements, a emitter-follower connected transistor $Q_0$, voltage-divider resistors $R_1$ and $R_2$, and resistors $R_3$ and $R_4$. The circuit of FIG. 5B has a diode $D_1$ as a constant voltage element and voltage-divider resistors $R_1$ and $R_2$.

In the comparator circuit of FIG. 4, when the input $V_{IN-}$ is in the range between 0 V and +5 V, the transistor $Q_{11}$ is off. Accordingly, the operation of the circuit of FIG. 4 is exactly the same as the circuit of FIG 1. Thus, the output $V_{OUT}$ becomes "H" when $V_{IN-} < V_{IN+}$, and the output $V_{OUT}$ becomes "L" when $V_{IN-} > V_{IN+}$. When the input $V_{IN-}$ becomes negative, and the input $V_{IN+}$ is a positive value, the transistor $Q_{11}$ becomes on. In this case, since $V_{IN-} < V_{IN+}$, the transistors $Q_1$ and $Q_2$ are off, therefore the transistors $Q_5$ and $Q_6$ are off. However, since the input $V_{IN-}$ becomes negative, the transistor $Q_3$ cannot drive the base current of the transistor $Q_7$, thus the transistor $Q_7$ is off, as described with regard to the circuit of FIG. 1. Thus, the constant current $I_2$ does not flow through the transistor $Q_7$, but flows through the transistor $Q_{11}$ to the input $V_{IN-}$. Accordingly, the transistor $Q_8$ is kept off, and the output $V_{OUT}$ is kept at "H". This "H" is the correct value corresponding to the input condition $V_{IN-} < V_{IN+}$.

As described above, in the comparator circuit of FIG. 4, the output $V_{OUT}$ is kept at the correct value corresponding to the input condition, i.e., whether $V_{IN-} < V_{IN+}$ or $V_{IN-} > V_{IN+}$, even if one input $V_{IN-}$ becomes negative.

Figure 6:
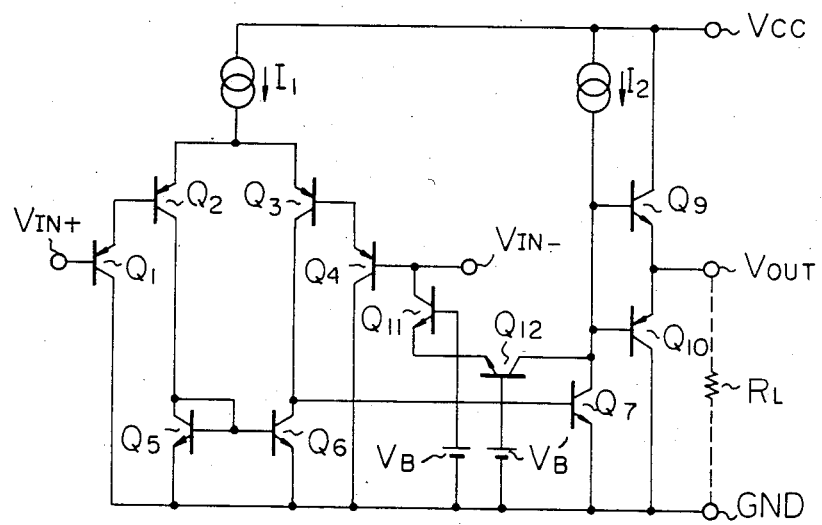
FIG. 6 is a diagram of a differential circuit according to another embodiment of the present invention.

A differential circuit according to another embodiment of the present invention is illustrated in FIG. 6. The differential circuit, an operational amplifier circuit, comprises differential stage transistors $Q_1$ through $Q_6$, a control transistor $Q_7$, output stage transistors $Q_9$ and $Q_{10}$, and constant current sources $I_1$ and $I_2$, just as the circuit of FIG. 3. It further comprises an npn transistor $Q_{11}$, a npn transistor $Q_{12}$, and constant voltage sources $V_B$ and $V_B'$. In the operational amplifier circuit of FIG. 6, the collector of the transistor $Q_{11}$ is connected to the base of the transistor $Q_4$, the emitter of the transistor $Q_{11}$ is connected to the emitter of the transistor $Q_{12}$, and the collector of the transistor $Q_{12}$ is connected to the collector of the transistor $Q_7$. The constant voltage source $V_B$ is connected between the base of the transistor $Q_{11}$ and ground GND, and the constant voltage source $V_B'$ is connected between the base of the transistor $Q_{12}$ and ground GND. The constant voltage source $V_B$ is set to a voltage of +0.2 V through +0.5 V and the constant voltage source $V_B'$ is set to a voltage of about +0.5 V.

In the operational amplifier circuit of FIG. 6, when the input $V_{IN-}$ is in the range between ground GND and the voltage supply $V_{CC}$, the transistors $Q_{11}$ and $Q_{12}$ are off. Thus, the operation of the circuit of FIG. 6 is exactly the same as the circuit of FIG. 3. In the operational amplifier circuit of FIG. 6, however, the output $V_{OUT}$ changes linearly between the voltage supply $V_{CC}$ and ground GND, and the voltage of the collector of the transistor $Q_7$ changes between the voltage supply $V_{CC}$ and ground GND. Thus, if the emitter of the transistor $Q_{11}$ were connected directly to the collector of the transistor $Q_7$, the transistor $Q_{11}$ might break down because of the low breakdown voltage of the reverse biased emitter-base voltage. The transistor $Q_{12}$ is inserted between the emitter of the transistor $Q_{11}$ and the collector of the transistor $Q_7$ in order to prevent the breakdown of the transistor $Q_{11}$. When the input $V_{IN-}$, i.e., the voltage of the base of the transistor $Q_4$, becomes negative, even though the transistor $Q_7$ becomes off, the transistors $Q_{11}$ and $Q_{12}$ become on and the current $I_2$ flows through the transistors $Q_{11}$ and $Q_{12}$ to the input $V_{IN-}$. As described above, therefore, output error owing to abnormal input can be prevented.

According to the present invention, there is provided a differential circuit producing an output in response to the difference between two inputs in which output error owing to abnormal input is prevented. Further, in the differential circuit according to the present invention, when a negative voltage is applied to the input $V_{IN-}$, the voltage of the input $V_{IN-}$ can be clamped by the current $I_2$ flowing through the transistor $Q_{11}$, so that damage of the internal circuit is prevented. Still further, according to the present invention, when the voltage supply is turned on, the rise of the voltage of the input $V_{IN-}$ is accelerated by the current $I_2$ flowing through the transistor $Q_{11}$.

We claim:

1. A differential circuit operatively connected to receive first and second input signals having potentials, comprising:
   a differential stage having first and second transistors for receiving the first and second input signals, respectively, said differential stage comparing the potentials of the first and second input signals to provide an output corresponding to a state of said second transistor;
   a control stage having a control transistor operatively connected to said differential stage, said control transistor being driven by the output of said differential stage;
   an output stage including an output transistor operatively connected to said control transistor, said output transistor having a base carrying a base current, the base current of said output transistor being controlled by said control transistor; and
   error-output preventing means, operatively connected between said differential stage and said control stage, including an error-output preventing transistor, said error-output preventing transistor becoming on when the potential of the second input signal becomes lower than a predetermined value, so as to keep said output transistor at a state corresponding to the relation of the potentials of the first and second input signals even if the potential of the second input signal becomes lower than the predetermined value.

2. A differential circuit as defined in claim 1, wherein said differential circuit is operatively connected to a voltage supply and a constant voltage source, and wherein said output transistor comprises a first npn transistor of the open-collector output type and wherein said error-output preventing transistor comprises a second npn transistor, the collector of said second npn transistor being operatively connected to said second transistor, the emitter of said second npn transistor being operatively connected to the base of said first npn transistor, and said constant voltage source being operatively connected between the base of said error output preventing transistor and the voltage supply.

3. A differential circuit as defined in claim 1, operatively connectable to a voltage supply, wherein said control transistor has a collector, said output transistor comprises a first npn transistor and said output stage further comprises a first pnp transistor, said first npn and pnp transistors being operatively connected in series between the voltage supply and ground so that the output of said differential circuit is changed linearly, wherein said error-output preventing transistor is a second npn transistor and wherein said error-output preventing means further comprises a third npn transistor and first and second constant voltage sources, the collector of said second npn transistor operatively connected to said second transistor, the emitter of said second npn transistor operatively connected to the emitter of said third npn transistor, the collector of said third npn transistor operatively connected to the collector of said control transistor, said first constant voltage source operatively connected between the base of said second npn transistor and ground, and said second constant voltage source operatively connected between the base of said third npn transistor and ground.

4. A differential circuit operatively connected to receive first and second input signals having potentials, comprising:

first and second transistors forming a differential stage, operatively connected to receive the first and second input signals, respectively, for comparing the potential difference between the first and second input signals and providing an output signal in response to the difference between the first and second input signals;

a control transistor, operatively connected to said differential stage, said control transistor being driven by the output signal of said differential stage;

an output transistor, operatively connected to said control transistor, said output transistor having a base current, the base current of said output transistor being controlled by said control transistor; and an error-output preventing transistor, operatively connected between said differential stage and said control transistor, for controlling said output transistor in dependence upon the potential difference between the first and second input signals even when the potential of the second input signal becomes lower than a predetermined value.

* * * * *